United States Patent
Im et al.

(10) Patent No.: US 7,585,683 B2
(45) Date of Patent: Sep. 8, 2009

(54) METHODS OF FABRICATING FERROELECTRIC DEVICES

(75) Inventors: Dong-Hyun Im, Gyeonggi-do (KR);
Byoung-Jae Bae, Gyeonggi-do (KR);
Ik-Soo Kim, Gyeonggi-do (KR);
Jang-Eun Heo, Seoul (KR);
Choong-Man Lee, Seoul (KR);
Dong-Chul Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 11/778,880

(22) Filed: Jul. 17, 2007

(65) Prior Publication Data

US 2008/0020489 A1 Jan. 24, 2008

(30) Foreign Application Priority Data

Jul. 18, 2006 (KR) .............. 10-2006-0066770

(51) Int. Cl.
*H01L 21/00* (2006.01)
(52) U.S. Cl. ............ 438/3; 438/513; 438/681; 257/E21.17; 257/E21.253; 257/E21.304; 257/E21.311; 257/E21.321
(58) Field of Classification Search .......... 438/3, 438/238, 381, 513, 311, 680, 681, 692, 905, 438/913
See application file for complete search history.

(56) References Cited

U.S. PATENT DOCUMENTS 6,194,228 B1   2/2001  Fujiki et al.
6,351,006 B1   2/2002  Yamakawa et al.
2005/0089632 A1*  4/2005  Vehkamaki et al. ...... 427/248.1
2006/0214204 A1*  9/2006  Yoo et al. ............... 257/295
2006/0263909 A1* 11/2006  Choi et al. .............. 438/3
2006/0273366 A1* 12/2006  Ko et al. ................ 257/295
2007/0148347 A1*  6/2007  Hatanpaa et al. ........ 427/248.1

FOREIGN PATENT DOCUMENTS

| JP | 2000-160341 | 6/2000 |
| KR | 1020010004306 A | 1/2001 |
| KR | 1020010113271 A | 12/2001 |
| KR | 1020030078394 A | 10/2003 |
| KR | 2004-0007439 | 1/2004 |
| KR | 1020040024658 A | 3/2004 |
| KR | 1020040034172 A | 4/2004 |

OTHER PUBLICATIONS

Notice to Submit Response corresponding to Korean Patent Application No. 10-2006-0066770 mailed Apr. 25, 2007.

* cited by examiner

*Primary Examiner*—David Nhu
(74) *Attorney, Agent, or Firm*—Myers Bigel Sibley & Sajovec, P.A.

(57) ABSTRACT

A method of fabricating a ferroelectric device includes forming a ferroelectric layer on a substrate in a reaction chamber. An inactive gas is provided into the reaction chamber while unloading the substrate therefrom to thereby substantially inhibit formation of an impurity layer on the ferroelectric layer.

23 Claims, 7 Drawing Sheets

METHODS OF FABRICATING FERROELECTRIC DEVICES

CROSS-REFERENCE TO RELATED APPLICATIONS

This application claims priority under 35 USC § 119 to Korean Patent Application No. 10-2006-0066770 filed on Jul. 18, 2006, the disclosure of which is hereby incorporated by reference herein in its entirety.

FIELD OF THE INVENTION

The present invention relates to semiconductor devices, and more particularly, to methods of forming ferroelectric devices and related devices.

BACKGROUND OF THE INVENTION

Semiconductor memory devices are generally divided into volatile semiconductor memory devices, such as dynamic random access memory (DRAM) devices and static random access memory (SRAM) devices, and nonvolatile semiconductor memory devices, such as erasable programmable read only memory (EPROM) devices, electrically erasable programmable read only memory (EEPROM) devices and flash memory devices. Volatile semiconductor memory devices may lose data stored therein when power is turned off, whereas nonvolatile semiconductor memory devices can maintain data stored therein after power is turned off.

In contrast, ferroelectric random access memory (FRAM) devices may have volatile characteristics of a RAM device and also nonvolatile characteristics of a ROM device. Currently, the operating speed of FRAM devices may be less than that of DRAM devices due to less advanced techniques for manufacturing FRAM devices. However, FRAM devices may have high data retention capabilities that can maintain data stored therein after power is off due at least in part to a ferroelectric layer with a spontaneous polarization characteristic. Accordingly, FRAM devices may be more suitable for use in an operating unit that does not require a rapid input/output of information, or in a memory device, that maintains stored information. Additionally, the FRAM device may be operated at a voltage lower than that of the EPROM device or the EEPROM device, and data stored in the FRAM device may be maintained for a longer storage time.

Ferroelectric materials such as PZT [$Pb(Zr, Ti)O_3$] and/or SBT ($SrBi_2Ta_2O_9$) may be used in FRAM devices. A ferroelectric layer of PZT may be formed at a relatively low temperature of below about 650° C. Additionally, the ferroelectric layer of PZT may have a relatively large polarization. However, the ferroelectric layer of PZT generally may have relatively poor fatigue characteristics and also may include harmful ingredients, such as lead (Pb). A ferroelectric layer of SBT may have improved fatigue characteristics and also may have a polarization-voltage (P-V) hysteresis that does not imprint in a specific direction. However, the ferroelectric layer of SBT may be formed through a thermal treatment at a relatively high temperature of above about 800° C.

Conventional methods of manufacturing FRAM devices including ferroelectric layers are disclosed in Korean Laid-Open Patent Publication No. 2001-113271, Korean Laid-Open Patent Publication No. 2001-4306, U.S. Pat. No. 6,351,006 issued to Yamakawa et al., and U.S. Pat. No. 6,194,228 issued to Fujiki et al.

When a ferroelectric layer including PZT is formed on a substrate by a metal organic chemical vapor deposition (MOCVD) process, the ferroelectric layer may have a rough surface such that the FRAM device including the rough ferroelectric layer may have relatively poor electrical and/or ferroelectric characteristics. In particular, an upper electrode may not be firmly attached to the rough ferroelectric layer, and as such, the upper electrode may be easily detached from the rough ferroelectric layer. Additionally, charges may be irregularly distributed on the rough surface of the ferroelectric layer which may thereby deteriorate the electrical characteristics of the FRAM device.

Korean Laid-Open Patent Publication No. 2004-34172 discloses a method of stabilizing a layer using tantalum oxide while providing a nitrogen gas. In this method, a formation process of the layer includes a stabilization process, a deposition process and a purging process. The stabilization process may be performed under an oxygen atmosphere, the deposition process may be performed under an inactive atmosphere, and the purging process may be performed under oxygen or nitrogen atmosphere. When the tantalum oxide layer is deposited, an inactive gas (such as a nitrogen gas without an oxygen gas) may be provided to reduce and/or prevent the formation of oxygen atoms on the lower electrode for depositing the tantalum oxide.

Additionally, to reduce and/or prevent the formation of byproducts between an upper electrode and a capping layer when the capping layer is formed on the upper electrode, Korean Laid-Open Patent Publication No. 2003-78394 discloses a method of stabilizing under a nitrogen atmosphere, and then purging the nitrogen gas. In the above method, after a capacitor including a lower electrode, a dielectric layer and an upper electrode is formed, the purging process may be performed to form a capping layer. In the stabilization process and/or the purging process, a nitrogen gas may be used to reduce and/or prevent an oxygen gas for forming the capping layer from diffusing to the upper electrode.

SUMMARY OF THE INVENTION

In accordance with some embodiments of the present invention, a method of fabricating a ferroelectric device includes forming a ferroelectric layer on a substrate in a reaction chamber. An inactive gas is provided into the reaction chamber while unloading the substrate therefrom. The inactive gas is configured to substantially inhibit formation of an impurity layer on the ferroelectric layer.

In accordance with other embodiments of the present invention, a method of fabricating a ferroelectric capacitor includes forming a lower electrode layer on a substrate, and forming a ferroelectric layer on the lower electrode layer in a reaction chamber. An inactive gas is provided into the reaction chamber while unloading the substrate therefrom to substantially inhibit formation of an impurity layer on the ferroelectric layer, and an upper electrode layer is formed on the ferroelectric layer.

In accordance with still other embodiments of the present invention, a method of forming a ferroelectric layer is provided. In the method, a carrier gas and at least one of an oxygen-containing gas and a first inactive gas may be provided into a reaction chamber before a substrate is loaded into the reaction chamber. A ferroelectric layer may be formed on the substrate after the substrate is loaded into the reaction chamber. A second inactive gas may be provided on the ferroelectric layer while the substrate is unloaded from the reaction chamber.

In some embodiments, the oxygen-containing gas may be an oxygen gas, an ozone gas, a nitrogen dioxide gas or a nitrous oxide gas. The first inactive gas may be an argon gas, a nitrogen gas or a helium gas. The carrier gas may be an argon gas, a nitrogen gas or a helium gas. The second inactive gas may be an argon gas, a nitrogen gas or a helium gas. The second inactive gas may be provided onto the ferroelectric layer for about 15 to about 200 seconds.

In other embodiments, the oxygen-containing gas or the first inactive gas may be provided at a flow rate substantially similar to that of the second inactive gas. In addition, a ratio of a flow rate of the oxygen-containing gas or the first inactive gas to that of the carrier gas may be about 2.5:1.0 to about 3.5:1.0.

In some embodiments, the ferroelectric layer may be thermally treated after the ferroelectric layer is formed. The ferroelectric layer may be thermally treated at a temperature of about 500 to about 650° C. for about 30 to about 180 seconds.

In some embodiments, the impurity layer may be reduced on the ferroelectric layer to have a leakage current density of about $1E^{-10}$ to about $1E^{-6}$ $A/cm^2$ in the ferroelectric layer.

In accordance with further embodiments of the present invention, a method of manufacturing a ferroelectric capacitor is provided. In the method, a lower electrode layer may be formed on a substrate. A carrier gas and at least one of an oxygen-containing gas and a first inactive gas may be provided into a reaction chamber before a substrate is loaded into the reaction chamber. A ferroelectric layer may be formed on the substrate after the substrate is loaded into the reaction chamber. A second inactive gas may be provided on the ferroelectric layer when the substrate is unloaded from the reaction chamber. An upper electrode layer may be formed on the ferroelectric layer.

In some embodiments, to form the lower electrode layer, a first lower electrode film may be formed on the substrate. A second lower electrode film may be formed on the first lower electrode film. To form the upper electrode layer, a first upper electrode film may be formed on the ferroelectric layer. A second upper electrode film may be formed on the first upper electrode film.

Accordingly, in some embodiments, an inactive gas may be provided to a ferroelectric layer formed on a conductive structure or on a lower electrode layer to substantially inhibit a reaction between a remaining gas in the ferroelectric layer formation process and an oxygen-containing gas from forming an impurity layer on the ferroelectric layer. Thus, the ferroelectric layer may have improved ferroelectric and electrical characteristics such as enhanced polarization or data retention, reduced leakage current density, etc. Furthermore, a ferroelectric capacitor including the ferroelectric layer may have improved electrical characteristics.

DETAILED DESCRIPTION OF EMBODIMENTS OF THE INVENTION

Figure 1:
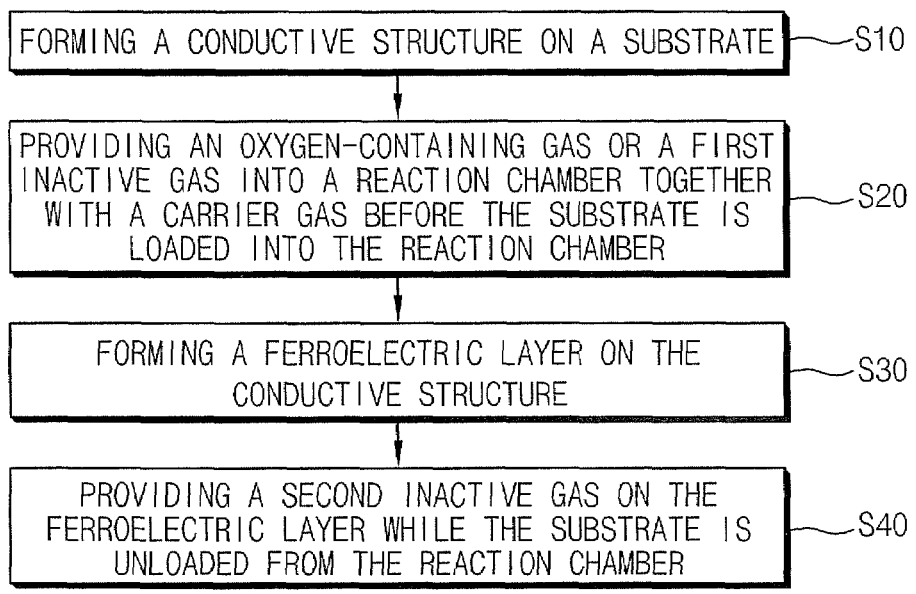
FIG. 1 is a flow chart illustrating a method of forming a ferroelectric layer in accordance with some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As appreciated by the present inventors, conventional methods, such as those discussed in Korean Laid-Open Patent Publication No. 2004-34172, may not disclose the use of a ferroelectric layer when performing a purging process and/or the effects on electrical characteristics, such as enhanced polarization or data retention. In addition, while Korean Laid-Open Patent Publication No. 2003-78394 discloses a method of using a nitrogen gas during a process for completing the capping layer on the upper electrode, it discloses using the nitrogen gas after forming the capacitor. Additionally, Korean Laid-Open Patent Publication No. 2003-78394 does not disclose an oxygen layer formed by providing a nitrogen gas during the purging process to react between a remaining gas in the formation process and an oxygen gas. Furthermore, the above Korean Laid-Open Patent Publication No. 2003-78394 does not disclose reduced leakage current density and/or polarization retention that may result from forming the upper electrode and/or the lower electrode by providing a nitrogen gas.

FIG. 1 is a flow chart illustrating a method of forming a ferroelectric layer in accordance with some embodiments of the present invention.

Referring to FIG. 1, a conductive structure is formed on a substrate as shown in block S10. Here, a semiconductor substrate, such as a silicon wafer and a silicon-on-insulator (SOI), is used for forming a ferroelectric layer on an upper portion of the conductive structure. Alternatively, the substrate may be a single crystalline metal oxide substrate such as a single crystalline aluminum oxide ($Al_2O_3$) substrate, a single crystalline strontium titanium oxide ($SrTiO_3$) substrate and a single crystalline magnesium oxide (MgO) substrate. When the substrate is the single crystalline metal oxide substrate, the thin ferroelectric layer may be directly formed on the substrate without forming the conductive structure.

The conductive structure may include first and second conductive layers that are successively formed on the substrate. The first conductive layer may serve as a barrier layer that reduces and/or prevents diffusion of oxygen into a ferroelectric layer that is formed over the first conductive layer. The second conductive layer may enhance crystallization characteristics of the ferroelectric layer.

The first conductive layer may be formed using a metal nitride. For example, the first conductive layer may be formed using titanium aluminum nitride (TiAlN), aluminum nitride (AlN), titanium nitride (TiN), titanium silicon nitride (TiSiN), tantalum nitride (TaN), tantalum silicon nitride (TaSiN), tungsten nitride (WN), etc. The first conductive layer may be formed on the substrate by an e-beam evaporation process, a chemical vapor deposition (CVD) process, an atomic layer deposition (ALD) process or a sputtering process. For example, titanium aluminum nitride (TiAlN) may be deposited by the sputtering process to form the first conductive layer on the substrate. The first conductive layer may have a thickness of about 10 to about 50 nm measured from an upper surface of the substrate.

The second conductive layer may be formed using a metal such as iridium (Ir), platinum (Pt), ruthenium (Ru), palladium (Pd), gold (Au), etc. The second conductive layer may be formed on the first conductive layer by an e-beam evaporation process, a sputtering process, a chemical vapor deposition (CVD) process, a pulse laser deposition (PLD) process or an atomic layer deposition (ALD) process. For example, the second conductive layer may be formed using iridium by the sputtering process. The second conductive layer may have a thickness of about 10 to about 200 nm measured from an upper surface of the first conductive layer.

As a result, the conductive structure including the first and second conductive layers may be provided on the substrate.

In some embodiments of the present invention, an insulation layer may be formed on the substrate before the conductive structure is formed. The insulation layer may be formed using an oxide. The insulation layer may be formed between the substrate and the conductive structure by a CVD process, a plasma-enhanced chemical vapor deposition (PECVD) process, a high-density plasma chemical vapor deposition (HDP-CVD) process, etc.

In other embodiments of the present invention, an adhesion layer may be formed between the insulation layer and the first conductive layer of the conductive structure. The adhesion layer may improve adhesive strength between the insulation layer and the first conductive layer. The adhesion layer may be formed using a metal or a conductive metal nitride. For example, the adhesion layer is formed using titanium (Ti), titanium nitride (TiN), tantalum (Ta), tantalum nitride (TaN), aluminum (Al), aluminum nitride (AlN), tungsten (W), tungsten nitride (WN), etc. The adhesion layer may be formed on the insulation layer by a sputtering process, a CVD process, a PLD process, an ALD process, etc.

The substrate on which the conductive structure is formed is provided into a reaction chamber to form the ferroelectric layer on the conductive structure. The reaction chamber may be suitable for performing a metal organic chemical vapor deposition (MOCVD) process, to thereby effectively form the ferroelectric layer on the substrate.

Before the substrate is provided into the reaction chamber, an oxygen-containing gas and/or a first inactive gas is provided onto the substrate together with a carrier gas as shown in block S20.

In some embodiments of the present invention, the oxygen-containing gas may include oxygen ($O_2$), ozone ($O_3$) or nitrogen dioxide ($NO_2$). These can be used alone and/or in a combination or mixture. Examples of gases that may be used as the first inactive gas may include an argon (Ar) gas, a nitrogen ($N_2$) gas, a helium (He) gas, etc. These gases may be used alone or in a combination thereof. In addition, examples of gases that may be used as the carrier gas may include an argon gas, a nitrogen gas, a helium gas, etc. These gases may be used alone or in a combination thereof. The first inactive gas may be substantially the same as the carrier gas. Alternatively, the first inactive gas may be substantially different from the carrier gas.

In some embodiments of the present invention, the oxygen-containing gas may include oxygen. In this case, the first inactive gas and the carrier gas may include a nitrogen gas and an argon gas, respectively.

The oxygen-containing gas and the first inactive gas may be introduced into the reaction chamber at substantially the same flow rates. In addition, a ratio of the flow rate of the oxygen-containing gas or the first inactive gas to a flow rate of the carrier gas may be in a range of about 2.5:1.0 to about 3.5:1.0.

Referring to FIG. 1, after the substrate is loaded into the reaction chamber, the ferroelectric layer is formed on the conductive structure located on the substrate as shown in block S30. The ferroelectric layer may be formed on the conductive structure by a MOCVD process, a CVD process and/or an ALD process. For example, the ferroelectric layer may be formed on the conductive structure using lead zirconate titanate (PZT) by the MOCVD process. Processes for forming the ferroelectric layer is described in detail hereinafter.

Figure 2:
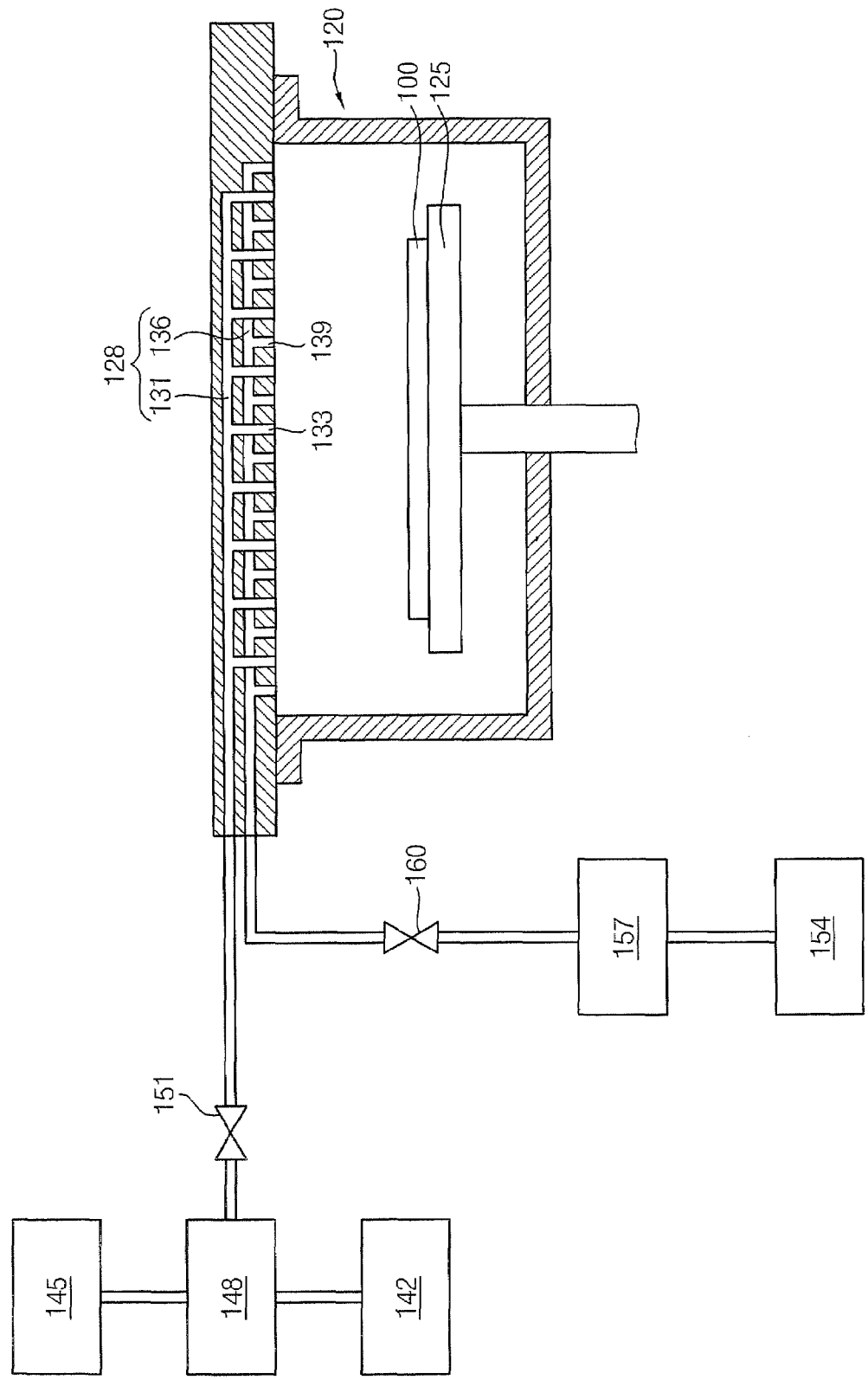
FIG. 2 is a cross-sectional view illustrating a metal organic chemical vapor deposition (MOCVD) device for forming a ferroelectric layer in accordance with some embodiments of the present invention.

FIG. 2 is a cross-sectional view illustrating a MOCVD device for performing a MOCVD process to form the ferroelectric layer in accordance with some embodiments of the present invention.

Referring to FIG. 2, the substrate 100 on which the conductive structure is formed is mounted on a susceptor 125 of a reaction chamber 120 for performing the MOCVD process. A temperature of the substrate 100 mounted on the susceptor 125 may be maintained between about 400° C. to about 650° C. while the ferroelectric layer is formed on the conductive structure. For example, the temperature 100 of the substrate may be maintained between about 550° C. to about 630° C. A pressure of the reaction chamber 120 may be maintained between about 0.5 Torr to about 3 Torr.

A showerhead 128 having first and second spraying ports 131 and 136 is located at an upper portion of the chamber 120. The first spraying port 131 may have a plurality of first nozzles 133. The second spraying port 136 may have a plurality of second nozzles 139. The first and second nozzles 131, 136 may be alternately disposed over the susceptor 125.

After a metal organic precursor is provided from a metal organic precursor source 142 into a vaporizer 148, the metal organic precursor is heated in the vaporizer 148. For example, the vaporizer 148 may be heated to a temperature of about 170° C. to about 250° C. The carrier gas is provided from a carrier gas source 145 into the vaporizer 148. Thereafter, the carrier gas is also heated in the vaporizer.

The metal organic precursor may include lead and/or a first compound containing lead, zirconium and/or a second compound containing zirconium, and titanium and/or a third compound containing titanium. Alternatively, the metal organic precursor may include a compound containing lead, zirconium and titanium.

The heated metal organic precursor and the heated carrier gas are provided onto the substrate 100 through the first nozzles 133 of the first spraying port 131.

An oxygen-containing gas used as an oxidant is provided from an oxidant source 154 into the heater 157. The oxygen-containing gas is then heated in the heater 157. The heated oxygen-containing gas is provided onto the substrate 100 through the second nozzles 139 of the second spraying port 136. A temperature of the heated oxygen-containing gas is maintained between about 300° C. to about 700° C. The oxygen-containing gas may include oxygen ($O_2$), ozone ($O_3$), nitrogen dioxide ($NO_2$) and/or nitrous oxide ($N_2O$).

While the ferroelectric layer is formed on the second conductive layer by a reaction between the metal organic precursor and the heated oxygen-containing gas, flow rates of the metal organic precursor with the heated oxygen-containing gas may be controlled using first and second valves 151, 160. For example, a flow rate of the heated oxygen-containing gas may be about 500 sccm to about 3,000 sccm. As a result, the ferroelectric layer including PZT formed by the MOCVD process may be formed on the conductive structure.

The substrate 100 is unloaded from the reaction chamber 120 and a second inactive gas is then provided onto the ferroelectric layer as shown in block S40. The second inactive gas is provided to reduce and/or prevent formation of an impurity layer on the ferroelectric layer due to a reaction between a remaining gas in the reaction chamber 120 and the oxygen-containing gas after forming the ferroelectric layer including PZT. Accordingly, the second inactive gas may be provided to substantially inhibit formation of an impurity layer on the ferroelectric layer due to the remaining gases in the reaction chamber 120. Here, when the second inactive gas is provided into the reaction chamber, the metal organic precursor and/or the oxygen-containing gas may not be provided into the reaction chamber. Examples of gases that may be used as the second inactive gas may include an argon gas, a nitrogen gas, a helium gas, etc. These gases may be used alone or in a combination thereof. In some embodiments of the present invention, the second inactive gas may be a nitrogen gas. The second inactive gas may be provided at a flow rate substantially the same as that of the carrier gas. For example, the second inactive gas may be provided at a flow rate of about 500 sccm to about 3,000 sccm. In addition, the second inactive gas may be provided for about 15 sec to about 200 sec. A temperature of the susceptor 125 may be reduced when the second inactive gas is provided. Thus, a temperature of the substrate 100 may also be reduced while the second inactive gas is supplied to the chamber 120.

When the ferroelectric layer such as a PZT layer has a relatively thin thickness, ferroelectric characteristics of the PZT layer may be reduced due to a dead-layer effect. More particularly, when the PZT layer has a relatively thin thickness, a remnant polarization (2 Pr) value of the PZT layer may decrease and coercive voltage characteristics of the PZT layer may be improved. As a result, the ferroelectric characteristics of the PZT layer may be deteriorated. According to some embodiments of the present invention, the second inactive gas may be provided to the ferroelectric layer including PZT to reduce and/or prevent a reaction between a remaining gas and the oxygen-containing gas from generating an impurity layer at the surface of the ferroelectric layer. As such, the second inactive gas may substantially inhibit formation of an impurity layer on the ferroelectric layer due to the remaining gases in the reaction chamber 120. Thus, the ferroelectric layer may have a relatively thin and uniform thickness. In addition, the ferroelectric layer may have improved ferroelectric characteristics and the dead-layer effect of the ferroelectric layer may be reduced. Thus, a ferroelectric capacitor including the ferroelectric layer may have improved electrical characteristics due to a reduced leakage current density between the impurity layer and an upper electrode layer formed on the ferroelectric layer. For example, the impurity layer is reduced and/or prevented by providing the second inactive gas so that the ferroelectric layer may have a reduced leakage current density of about $1 E^{-10}$ to about $1 E^{-6}$ A/cm$^2$.

Figure 3:
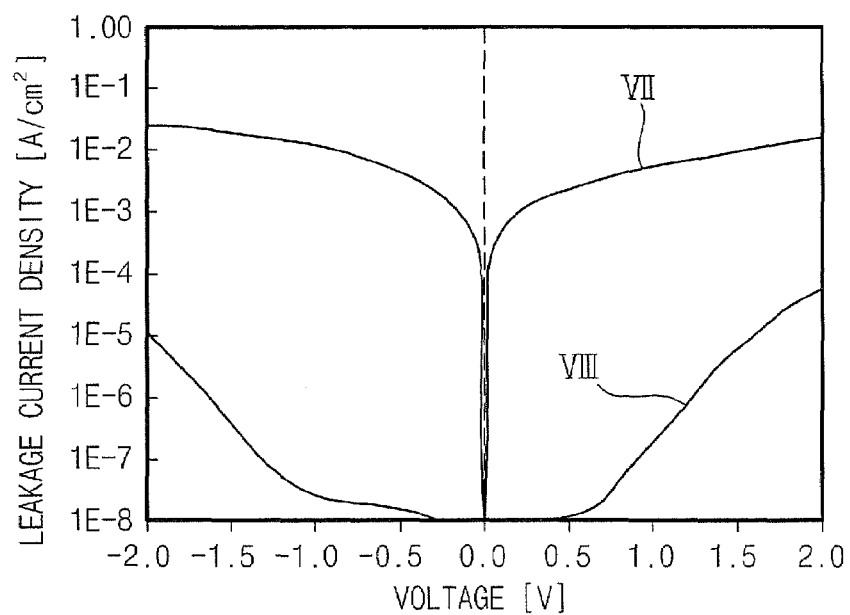
FIG. 3 is a graph illustrating leakage current densities of a ferroelectric layer where a nitrogen gas is provided and a ferroelectric layer where an oxygen gas is provided in accordance with some embodiments of the present invention.

FIG. 3 is a graph illustrating leakage current densities of a ferroelectric layer where a nitrogen gas is provided and a ferroelectric layer where an oxygen gas is provided. In FIG. 3, VII and VIII indicate leakage current densities of the ferroelectric layer where the oxygen gas and the nitrogen gas are provided, respectively, as the second inactive gas.

Referring to FIG. 3, the ferroelectric layer (VII) where the oxygen gas is provided had a leakage current density of about 0.005 A/cm$^2$, and the ferroelectric layer VIII where the nitrogen gas is provided had a leakage current density of about 0.000001 A/cm$^2$ when an induced voltage is in a range of about −2V to about +2V. Thus, the leakage current characteristics of the ferroelectric layer VIII where the nitrogen gas is provided may be improved relative to that of the ferroelectric layer VII where the oxygen gas is provided.

Figure 4:
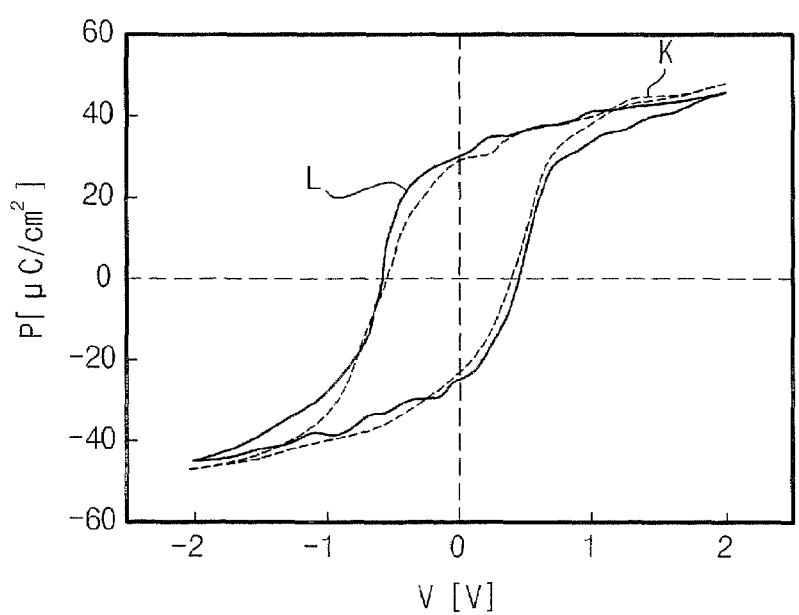
FIG. 4 is a graph illustrating polarization-electric field (P-E) hysteresis loops of ferroelectric layers where a nitrogen gas and an oxygen gas are provided in accordance with some embodiments of the present invention.
Figure 5:
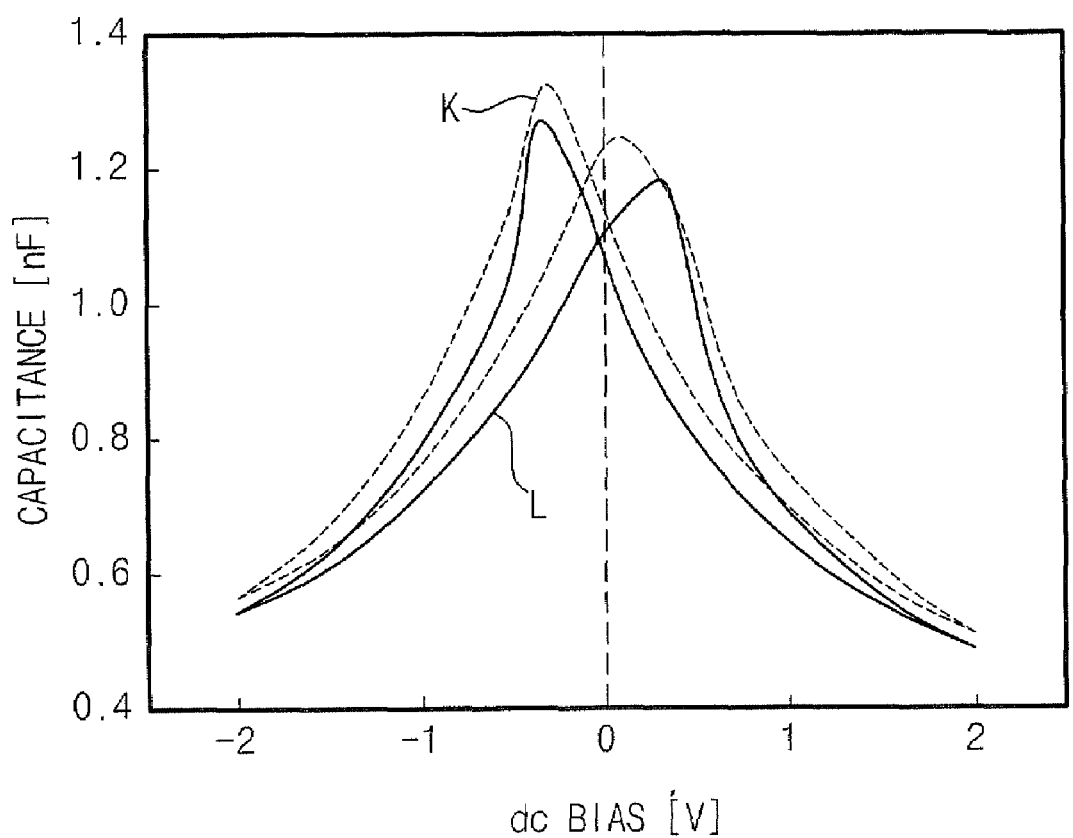
FIG. 5 is a graph illustrating capacitance of a ferroelectric capacitor including ferroelectric layers where a nitrogen gas and an oxygen gas are provided in accordance with some embodiments of the present invention.

FIG. 4 is a graph illustrating polarization-electric field (P-E) hysteresis loops of ferroelectric layers where the nitrogen gas and the oxygen gas are provided relative to ferroelectric layers where gases are not provided. FIG. 5 is a graph illustrating capacitance of a ferroelectric capacitor including ferroelectric layers where the nitrogen gas and the oxygen gas are provided. Referring to FIGS. 4 and 5, the oxygen gas and nitrogen gas are provided at a flow rate of about 500 to about 3,000 sccm under the pressure of about 2 Torr. In FIGS. 4 and 5, K indicates the ferroelectric layer where the oxygen gas is provided, and L indicates the ferroelectric layer where the nitrogen gas is provided.

When a thickness of the ferroelectric layer formed on the conductive layer is reduced, a remnant polarization may also be decreased. In addition, peaks of the capacitances may not be as efficiently discerned according to positive and negative bias voltages. However, as shown in FIGS. 4 and 5, when a nitrogen gas is provided on the ferroelectric layer L, the polarization-electric field (P-E) hysteresis loop of ferroelectric layer L may be deteriorated less than the ferroelectric layer K where an oxygen gas is provided. In addition, the peaks of the capacitances may be more efficiently discerned.

In some embodiments of the present invention, after drying the ferroelectric layer on which the impurity layer is hardly formed, the dried ferroelectric layer is thermally treated so that the damage to the surface of the ferroelectric layer may be substantially cured. This curing process may be performed at a temperature of about 500 to about 650° C. for about 30 to about 180 seconds. The surface of the ferroelectric layer may be cured under an inactive gas atmosphere. The inactive gas may include a nitrogen gas, a helium gas, an argon gas, a neon gas, etc.

Figure 6:
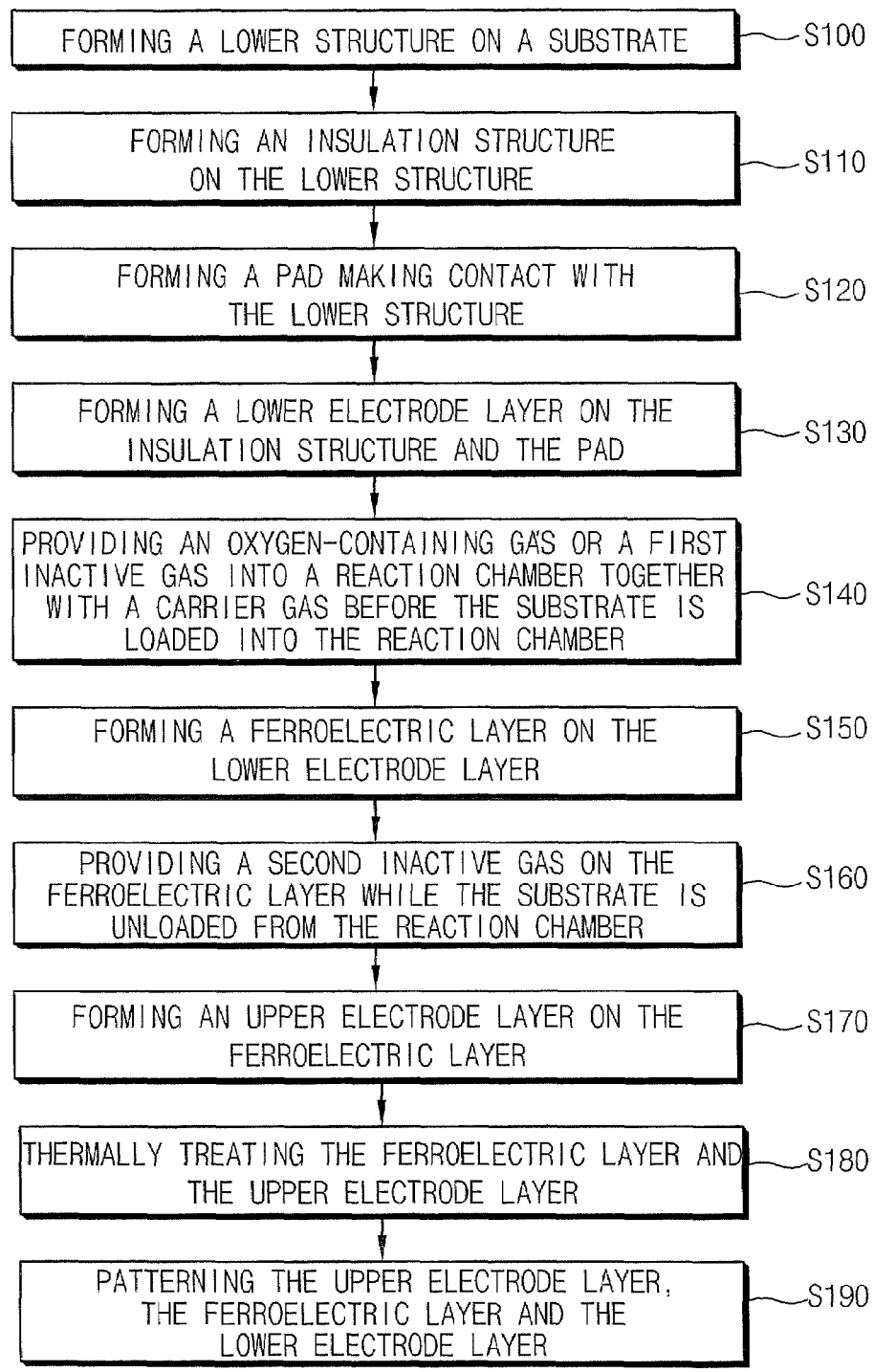
FIG. 6 is a flow chart illustrating a method of manufacturing a ferroelectric capacitor including a ferroelectric layer in accordance with some embodiments of the present invention.

FIG. 6 is a flow chart illustrating methods of manufacturing a ferroelectric capacitor including a ferroelectric layer in accordance with some embodiments of the present invention. FIGS. 7 to 10 are cross-sectional views illustrating a method of manufacturing a ferroelectric capacitor in accordance with some embodiments of the present invention.

Figure 7:
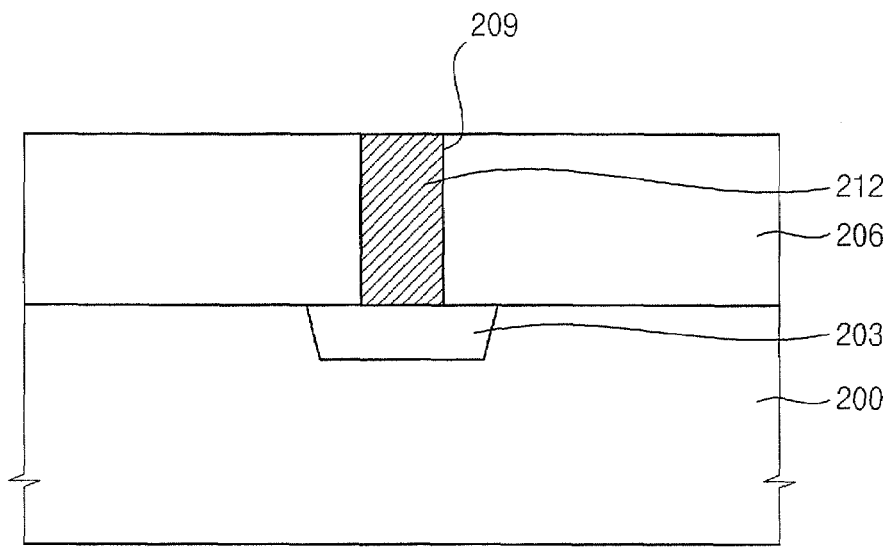
FIGS. 7 to 10 are cross-sectional views illustrating methods of manufacturing a ferroelectric capacitor in accordance with some embodiments of the present invention.

Referring to FIGS. 6 and 7, a lower structure 203 is formed on a semiconductor substrate 200 as shown in block S100. The substrate 200 may include a semiconductor substrate or a metal oxide substrate. For example, the substrate 200 may be a silicon wafer, an SOI substrate, a single crystalline aluminum oxide substrate, a single crystalline strontium titanium oxide substrate, a single crystalline magnesium oxide substrate, etc. The lower structure 203 may include a contact region, a conductive wiring, a conductive pattern, a pad, a plug, a contact, a gate structure, a transistor, etc.

An insulation structure 206 is formed on the substrate 200 to cover the lower structure 203 as shown in step S110. The insulation structure 206 may be formed by a CVD process, a PECVD process, an HDP-CVD process, an ALD process, etc.

In some embodiments of the present invention, the insulation structure 206 may include at least one insulation layer or an insulation interlayer formed using an oxide such as boro phosphosilicate glass (BPSG), phosphosilicate glass (PSG), undoped silicate glass (USG), spin-on glass (SOG), field oxide (FOx), plasma-enhanced tetraethyl orthosilicate (PE-TEOS), HDP-CVD oxide, etc. In other embodiments of the present invention, the insulation structure 206 may include a first insulation layer and a second insulation layer. Here, the first insulation layer may be formed using the oxide such as silicon oxide, and the second insulation layer may be formed using a nitride such as silicon nitride. In still other embodiments of the present invention, the insulation structure 206 may include a plurality of first insulation layers and a plurality of second insulation layers alternately formed on the substrate 200.

The insulation structure 206 is partially etched to form an opening or a hole 209 that partially exposes the lower structure 203. In some embodiments of the present invention, a first photoresist pattern (not shown) is formed on the insulation structure 206, and then the hole 209 is formed through the insulation structure 206 by etching the insulation structure 206 using the first photoresist pattern as an etching mask. The first photoresist pattern is removed from the insulation structure 206, for example, by an ashing process and/or a stripping process. In other embodiments of the present invention, an anti-reflection layer may be formed between the insulation structure 206 and the first photoresist pattern to provide a process margin of the etching process for forming the hole 209.

After a first conductive layer is formed on the insulation structure 206 to fill at least a portion of the hole 209, the first conductive layer is partially removed until the insulation structure 206 is exposed, thereby forming a pad or plug 212 making contact with the lower structure 203 in the hole 209 as shown in block S120.

The first conductive layer may be formed using a conductive material such as polysilicon doped with impurities, a metal or a conductive metal nitride. For example, the first conductive layer may include tungsten, aluminum, copper, titanium, tungsten nitride, aluminum nitride, titanium nitride, etc. The first conductive layer may be formed by a sputtering process, a CVD process, an ALD process, a PLD process, etc. The pad 212 may be formed using a CMP process, an etch back process, or a combination process of the CMP and the etch back to remove the first conductive layer. The pad 212 electrically connects a lower electrode 245 (see FIG. 10) to the lower structure 203.

Figure 8:
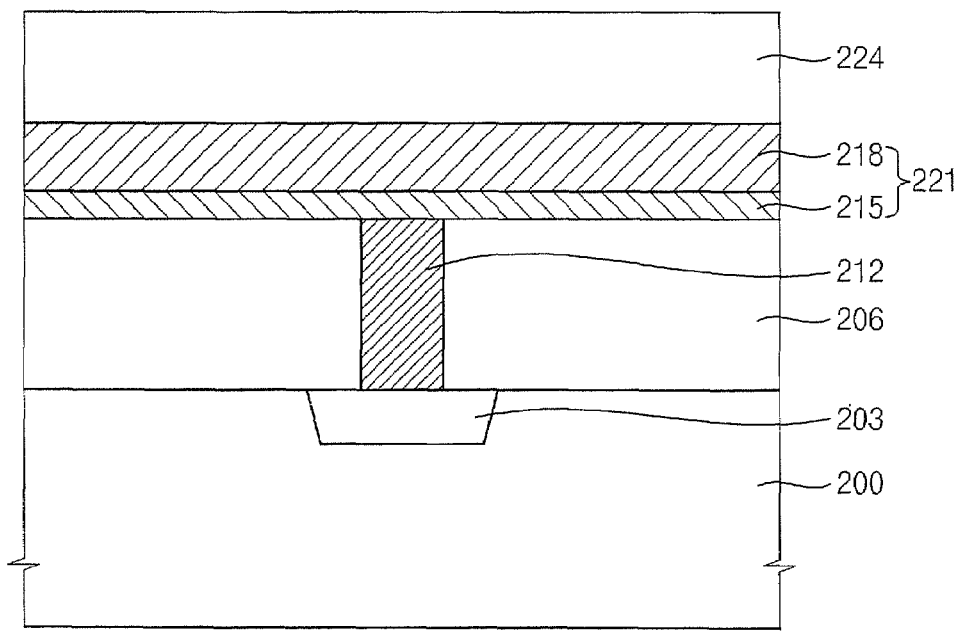

Referring to FIGS. 6 and 8, a lower electrode layer 221 is formed on the insulation structure 206 and the pad 212 as shown in block S130. The lower electrode layer 221 includes a first lower electrode film 215 formed on the pad 212 and the insulation structure 206, and a second lower electrode film 218 formed on the first lower electrode film 215.

The first lower electrode film 215 may be formed using metal nitride while performing an electron beam evaporation process, a sputtering process, a CVD process, a PLD process or an ALD process. For example, the first lower electrode film 215 may be formed using titanium aluminum nitride (TiAlN), titanium nitride (TiN), titanium silicon nitride (TiSiN), tantalum nitride (TaN), tungsten nitride (WN), tantalum silicon nitride (TaSiN), etc. The first lower electrode film 215 may have a thickness of about 10 to about 50 nm measured from an upper surface of the insulation structure 206.

In some embodiments of the present invention, the second lower electrode film 218 may be formed on the first lower electrode film 215 using a metal such as iridium (Ir), platinum (Pt), ruthenium (Ru), palladium (Pd), gold (Au), etc. In other embodiments of the present invention, the second lower electrode film 218 may be formed on the first lower electrode film 215 using iridium ruthenium alloy (Ir—Ru) or iridium oxide ($IrO_2$), strontium ruthenium oxide ($SrRuO_3$), calcium nickel oxide ($CaNiO_3$), calcium ruthenium oxide ($CaRuO_3$), etc. In still other embodiments of the present invention, the second lower electrode film 218 may be formed using a more complex structure of strontium ruthenium oxide/iridium and/or iridium oxide/iridium. The second lower electrode 218 may be formed by an electron beam evaporation process, a sputtering process, a CVD process, an ALD process, a PLD process, etc. The second lower electrode film 218 may have a thickness of about 10 to about 200 nm measured from an upper face of the first lower electrode film 215. For example, the second lower electrode film 218 may be formed on the first lower electrode film 215 using iridium by the sputtering process. When forming the second lower electrode film 218, a reaction chamber where the substrate 200 is loaded may have a temperature of about 20 to about 350° C. and a pressure of about 3 to about 10 mTorr. The second lower electrode film 218 may be formed by applying a power of about 300 to about 1,000 W under an inactive gas atmosphere. The inactive gas may include an argon gas, a nitrogen gas, a helium gas, etc. For example, the inactive gas may include argon gas only, and may have a flow rate of about 10 to about 100 sccm.

In some embodiments of the present invention, an adhesion layer may be formed between the insulation structure 206 and the first lower electrode film 215 to improve adhesive strength between the insulation structure 206 and the first lower electrode film 215. The adhesion layer may be formed using a metal and/or a conductive metal nitride by a sputtering process, a CVD process, an ALD process and/or a PLD process. For example, the adhesion layer may be formed using titanium, tantalum, aluminum, tungsten, titanium nitride, tantalum nitride, aluminum nitride, tungsten nitride, etc.

Referring now to FIGS. 6 and 8, before the substrate 200 is loaded in a MOCVD reaction chamber, a carrier gas may be provided into the reaction chamber together with an oxide-containing gas and/or with a first inactive gas to form the ferroelectric layer 224 on the first lower electrode layer 218 as shown in block S140. The oxygen-containing gas may include an oxygen ($O_2$) gas, an ozone ($O_3$) gas, a nitrogen dioxide ($NO_2$) gas and/or a nitrous oxide ($N_2O$) gas. The first inactive gas may include an argon (Ar) gas, a nitrogen ($N_2$) gas and/or a helium (He) gas, etc. In some embodiments, the oxygen-containing gas may include oxygen, the first inactive gas may include a nitrogen gas, and the carrier gas may include an argon gas. In some embodiments of the present invention, the oxygen-containing gas may be provided at a flow rate substantially similar to that of the first inactive gas. For example, the oxygen-containing gas and the first inactive gas may be provided at a flow rate of about 500 to about 3,000 sccm. In addition, a pressure in the reaction chamber may be maintained at about 0.5 to about 3 Torr. The first inactive gas and the oxygen-containing gas are heated to a temperature of about 300 to about 700° C. and then provided onto the substrate. In addition, a ratio of a flow rate of the oxygen-containing gas to a flow rate of the carrier gas may be in a range of about 2.5:1.0 to about 3:5:1.0.

After the substrate 200 is loaded into the reaction chamber, the ferroelectric layer 224 is formed on the second lower electrode film 218 with the carrier gas and the oxide-containing gas and/or the first inactive gas that are provided into the reaction chamber as shown in block S150. For example, the ferroelectric layer 224 may have a thickness of about 10 to about 200 nm measured from an upper surface of the second lower electrode film 218. In some embodiments of the present invention, the ferroelectric layer 224 may be formed using a ferroelectric material such as PZT [$Pb(Zr, Ti)O_3$], SBT ($SrBi_2Ta_2O_3$), BLT [$(Bi, La)TiO_3$], PLZT [$Pb(La, Zr)TiO_3$], or BST [$(Bi, Sr)TiO_3$]. For example, the ferroelectric layer 224 may be formed using PZT by a MOCVD process. More particularly, PZT included in the ferroelectric layer 224 may have an atomic ratio of about 1.0:0.2:0.8:3.0 to about 1.0:0.5:0.5:3.0 in lead, zirconium, titanium and oxygen. In other embodiments of the present invention, the ferroelectric layer 224 may be formed using a ferroelectric material such as PZT [$Pb(Zr, Ti)O_3$], SBT ($SrBi_2Ta_2O_3$), BLT [$(Bi, La)TiO_3$], PLZT [$Pb(La, Zr)TiO_3$], BFO [$BiFeO_3$] or BST [$(Bi, Sr)TiO_3$].

A metal organic precursor, the oxygen-containing gas and the carrier gas are provided into the reaction chamber. The metal organic precursor may have a β-diketonate typed ligand such as a tetramethyl heptanedionate typed source. Processes for forming the ferroelectric layer 224 on the lower electrode layer 221 may be substantially similar to those illustrated in FIG. 1. Thus, further explanation will be omitted.

While the substrate 200 is unloaded from the reaction chamber, a second inactive gas is provided to the ferroelectric layer 224 as shown in block S160. The second inactive gas is provided into the reaction chamber to reduce and/or prevent a reaction between a remaining gas in the reaction chamber and the oxygen-containing gas from forming an impurity layer on the ferroelectric layer. For example, the second inactive gas may include an argon gas, a nitrogen gas and/or a helium gas. In some embodiments, the second inactive gas may include a nitrogen gas. For example, the second inactive gas may be provided at a flow rate of about 500 to about 3,000 sccm. In addition, the second inactive gas may be provided on the ferroelectric layer 224 for a short time of about 15 to about 30 seconds. Here, when the second inactive gas is provided, a temperature of the substrate 200 unloaded from the reaction chamber may be reduced. Accordingly, the second inactive gas may be provided to substantially inhibit formation of an impurity layer on the ferroelectric layer due to the remaining gases in the reaction chamber.

Figure 9:
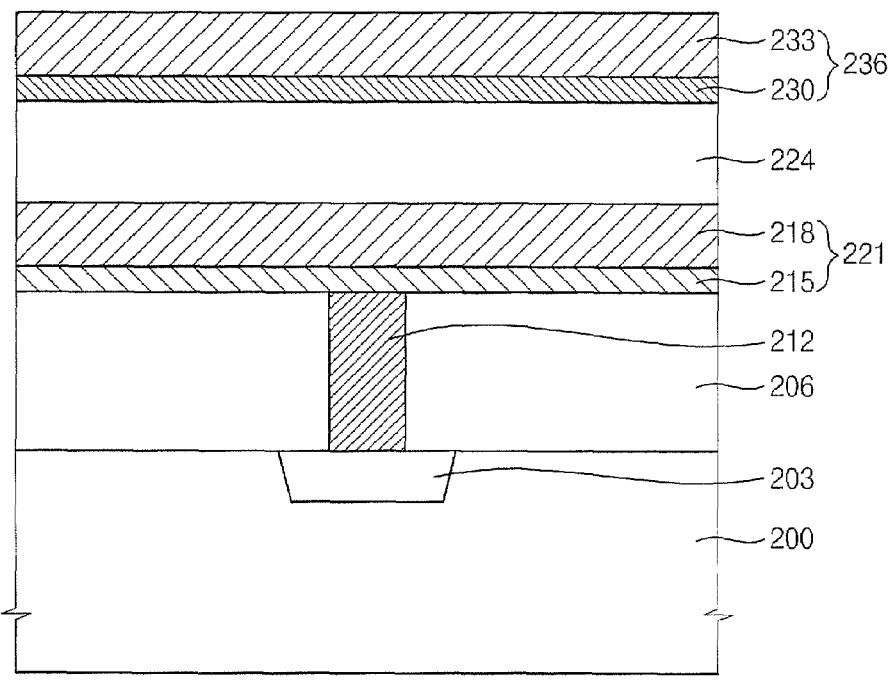

Referring to FIGS. 6 and 9, an upper electrode layer 236 is formed on the ferroelectric layer 224 as shown in block S170. The upper electrode layer 236 includes a first upper electrode film 230 formed on the ferroelectric layer 224, and a second upper electrode film 233 formed on the first upper electrode film 230.

The first upper electrode film 230 may be formed on the ferroelectric layer 224 by an electron beam evaporation process, a sputtering process, a CVD process and/or an ALD process. The first upper electrode film 230 may have a thickness of about 1 to about 20 nm measured from an upper surface of the ferroelectric layer 224. The first upper electrode film 230 may be formed using a metal oxide such as strontium ruthenium oxide ($SrRuO_3$; SRO), strontium titanium oxide ($SrTiO_3$; STO), lantan nickel oxide ($LnNiO_3$; LNO) or calcium ruthenium oxide ($CaRuO_3$; CRO). For example, the first upper electrode film 230 may be formed using SRO by a sputtering process. While forming the first upper electrode film 230, the reaction chamber where the substrate 200 is loaded may have a temperature of about 20 to about 350° C. and a pressure of about 3 to about 10 mTorr. The first upper electrode film 230 may be formed in a reaction chamber by applying a power of about 300 to about 1,000 W under an inactive gas atmosphere. In some embodiments, the upper electrode 236 may be formed in a different reaction chamber than the ferroelectric layer 224. The inactive gas may include an argon gas, a nitrogen gas or a helium gas or a mixture thereof. For example, the inactive gas may only include the argon gas and may have a flow rate of about 10 to about 100 sccm.

The second upper electrode film 233 may be formed using a metal such as iridium, platinum, ruthenium, palladium or gold. The second upper electrode film 233 may have a thickness of about 10 to about 200 nm measured from an upper face of the first upper electrode film 230. In some embodiments of the present invention, the second upper electrode film 233 may be formed using iridium ruthenium alloy or a metal oxide such as iridium oxide ($IrO_2$), calcium nickel oxide ($CaNiO_3$) or CRO ($CaRuO_3$). In other embodiments of the present invention, the second upper electrode film 233 may be formed using a more complex structure of SRO/iridium or iridium oxide/iridium. The second upper electrode film 233 may be formed by an electron beam evaporation process, a sputtering process, a CVD process and/or an ALD process. For example, the second upper electrode film 233 may be formed using iridium by the sputtering process. While forming the second upper electrode film 233, the reaction chamber including the substrate 200 may have a temperature of about 20 to about 350° C. and a pressure of about 3 to about 10 mTorr. The second upper electrode film 233 may be formed in the reaction chamber by applying a power of about 300 to about 1,000 W under an inactive gas atmosphere. The inactive gas may include an argon gas, a nitrogen gas, a helium gas or a mixture thereof. For example, the second upper electrode film 233 may be formed under an inactive gas atmosphere only including argon gas with a flow rate of about 10 to about 100 sccm.

In block S180, after forming the upper electrode layer 236 on the ferroelectric layer 224, the ferroelectric layer 224 and the upper electrode layer 236 are thermally treated to crystallize at least some elements of the ferroelectric layer 224 and/or the first upper electrode film 230. The ferroelectric layer 224 and the first upper electrode film 230 may be thermally treated by a rapid thermal annealing (RTA) process under an oxygen atmosphere, a nitrogen atmosphere and/or an atmosphere including oxygen and nitrogen. The ferroelectric layer 224 and the first upper electrode film 230 may be thermally treated at a temperature of about 500 to about 650° C. for about 30 to about 180 seconds.

Figure 10:
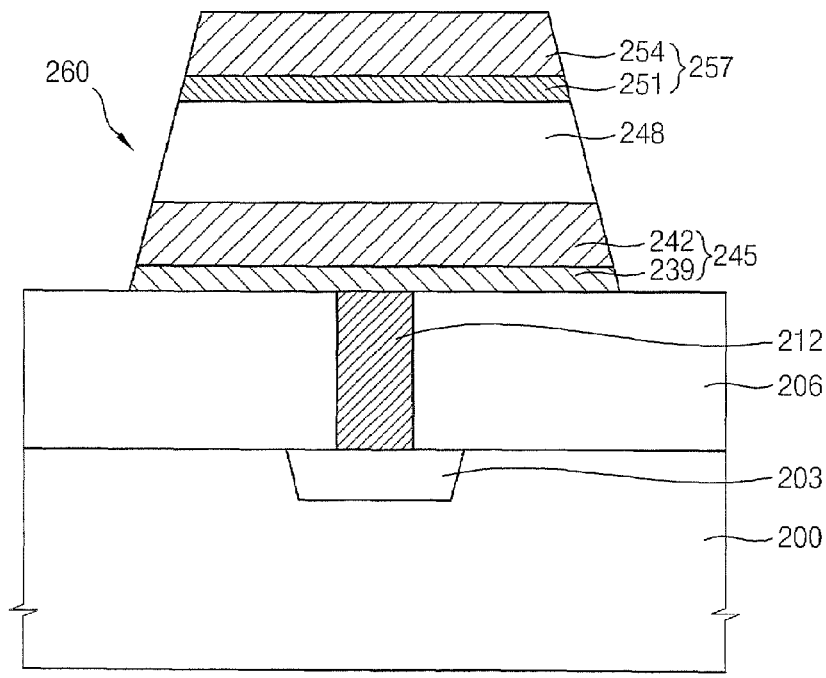

Referring to FIGS. 6 and 10, a second photoresist pattern (not shown) is formed on the second upper electrode film 233. The second upper electrode film 233, the first upper electrode film 230, the ferroelectric layer 224, the second lower electrode film 218 and the first lower electrode film 215 are sequentially etched using the second photoresist pattern as an etching mask so that the ferroelectric capacitor 260 may be formed over the substrate 200 as shown in block S190.

The ferroelectric capacitor 260 includes the lower electrode 245, a ferroelectric layer pattern 248 and the upper electrode 257 sequentially formed on the insulation structure 206 and the pad 212. The lower electrode 245 includes a first lower electrode film pattern 239 and a second lower electrode film pattern 242 sequentially formed on the pad 212 and the insulation structure 206. The upper electrode 257 includes a first upper electrode film pattern 251 and a second upper electrode film pattern 254 successively formed on the ferroelectric layer pattern 248. After the etching process is carried out, the ferroelectric capacitor 260 has a sidewall substantially inclined by an angle of about 50 to about 800 relative to a horizontal direction to the substrate 200.

According to some embodiments of the present invention, after the ferroelectric layer 224 is formed, the formation of the impurity layer may be reduced and/or prevented by providing the second inactive gas so that the ferroelectric layer 224 may have a substantially level surface, and the upper electrode layer 236 may be less likely to be detached from the ferroelectric layer 224 due to enhanced adhesive strength between the ferroelectric layer 224 and the upper electrode layer 236. In addition, the problem of charges being irregularly dispersed on the surface of the ferroelectric layer may be reduced and/or prevented and the dead-layer effect of the ferroelectric layer may be reduced. For example, the impurity layer is reduced and/or prevented by providing the second inactive gas so that the ferroelectric layer may have a reduced leakage current density of about $1 E^{-10}$ to about $1 E^{-6}$ $A/cm^2$. As a result, the ferroelectric capacitor 260 including the ferroelectric layer 224 may have improved electrical characteristics.

An additional insulation layer (not shown) may also be formed on the upper electrode 257, and an upper wiring (not shown) connected to the upper electrode 257 may be formed on the additional insulation layer, thereby forming a semiconductor device including the ferroelectric capacitor 270.

According to some embodiments of the present invention, an inactive gas may be provided to a ferroelectric layer formed on a conductive structure or a lower electrode layer to reduce and/or prevent a reaction between a remaining gas in the ferroelectric layer formation process and an oxygen-containing gas from forming an impurity layer on the ferroelectric layer. As such, the second inactive gas may be provided into the reaction chamber to substantially inhibit formation of an impurity layer on the ferroelectric layer. Thus, the ferroelectric layer may have improved ferroelectric and/or electrical characteristics such as enhanced polarization or data retention, reduced leakage current density, etc. Furthermore, a ferroelectric capacitor including the ferroelectric layer may have improved electrical characteristics.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A method of fabricating a ferroelectric device, comprising:
   providing a carrier gas and at least one of an oxygen-containing gas and a first inactive gas into a reaction chamber to form a ferroelectric layer on a substrate in the reaction chamber; and
   providing a second inactive gas to the ferroelectric layer while unloading the substrate from the reaction chamber, wherein the second inactive gas substantially inhibits remaining gases in the reaction chamber from forming an impurity layer on the ferroelectric layer.

2. The method of fabricating the ferroelectric device of claim 1, wherein forming the ferroelectric layer comprises:
providing the carrier gas and at least one of the oxygen-containing gas and the first inactive gas into the reaction chamber before the substrate is loaded into the reaction chamber; and
forming the ferroelectric layer on the substrate after the substrate is loaded into the reaction chamber.

3. The method of fabricating the ferroelectric device of claim 1, wherein the oxygen-containing gas comprises an oxygen gas, an ozone gas, a nitrogen dioxide gas and/or a nitrous oxide gas.

4. The method of fabricating the ferroelectric device of claim 1, wherein the first inactive gas and/or the carrier gas comprises an argon gas, a nitrogen gas and/or a helium gas.

5. The method of fabricating the ferroelectric device of claim 1, wherein the oxygen-containing gas and/or the first inactive gas is provided at a flow rate substantially similar to that of the second inactive gas.

6. The method of fabricating the ferroelectric device of claim 1, wherein a ratio of a flow rate of the oxygen-containing gas and/or the first inactive gas to a flow rate of the carrier gas is about 2.5:1.0 to about 3.5:1.0.

7. The method of fabricating the ferroelectric device of claim 1, wherein forming the ferroelectric layer comprises:
depositing a lead zirconate titanate (PZT) layer by a metal organic chemical vapor deposition process.

8. The method of fabricating the ferroelectric device of claim 1, wherein the second inactive gas comprises an argon gas, a nitrogen gas and/or a helium gas.

9. The method of fabricating the ferroelectric device of claim 8, wherein the second inactive gas is provided to the ferroelectric layer for about 15 to about 200 seconds.

10. The method of fabricating the ferroelectric device of claim 1, further comprising thermally treating the ferroelectric layer.

11. The method of fabricating the ferroelectric device of claim 10, wherein thermally treating the ferroelectric layer comprises thermally treating the ferroelectric layer at a temperature of about 500 to about 650° C. for about 30 to about 180 seconds.

12. The method of fabricating the ferroelectric device of claim 1, wherein the impurity layer is reduced on the ferroelectric layer to have a leakage current density of about $1 E^{-10}$ to about $1 E^{-6}$ A/cm$^2$ in the ferroelectric layer.

13. A method of fabricating a ferroelectric capacitor, comprising:
forming a lower electrode layer on a substrate;
providing a carrier gas and at least one of an oxygen-containing gas and a first inactive gas into a reaction chamber to form a ferroelectric layer on the lower electrode layer in the reaction chamber;
providing a second inactive gas to the ferroelectric layer while unloading the substrate from the reaction chamber; and
forming an upper electrode layer on the ferroelectric layer,
wherein the second inactive gas substantially inhibits a reaction with remaining gases in the reaction chamber from forming an impurity layer on the ferroelectric layer.

14. The method of fabricating the ferroelectric capacitor of claim 13, wherein forming the ferroelectric layer comprises:
providing the carrier gas and at least one of the oxygen-containing gas and the first inactive gas into the reaction chamber before the substrate is loaded into the reaction chamber; and
forming the ferroelectric layer after the substrate is loaded into the reaction chamber.

15. The method of fabricating the ferroelectric capacitor of claim 13, wherein forming the lower electrode layer comprises:
forming a first lower electrode film on the substrate; and
forming a second lower electrode film on the first lower electrode film.

16. The method of fabricating the ferroelectric capacitor of claim 15, wherein the first lower electrode film is formed using a metal nitride, and wherein the second lower electrode film is formed using a metal, a metal oxide and/or a metal oxide/metal.

17. The method of fabricating the ferroelectric capacitor of claim 13, wherein the first inactive gas, the second inactive gas and/or the carrier gas comprises an argon gas, a nitrogen gas and/or a helium gas.

18. The method of fabricating the ferroelectric capacitor of claim 13, wherein the oxygen-containing gas comprises an oxygen gas, an ozone gas, a nitrogen dioxide gas and/or a nitrous oxide gas.

19. The method of fabricating the ferroelectric capacitor of claim 13, wherein a ratio of a flow rate of the oxygen-containing gas and/or the first inactive gas to a flow rate of the second inactive gas is about 1.0:1.0, and wherein a ratio of a flow rate of the oxygen-containing gas and/or the first inactive gas to a flow rate of the carrier gas is about 2.5:1.0 to about 3.5:1.0.

20. The method of fabricating the ferroelectric capacitor of claim 13, wherein forming the upper electrode layer comprises:
forming a first upper electrode film on the ferroelectric layer; and
forming a second upper electrode film on the first upper electrode film.

21. The method of fabricating the ferroelectric capacitor of claim 20, wherein the first upper electrode film is formed using a metal nitride, and wherein the second upper electrode film is formed using a metal, a metal oxide and/or a metal oxide/metal.

22. The method of fabricating the ferroelectric capacitor of claim 13, further comprising:
thermally treating the ferroelectric layer and the upper electrode layer.

23. The method of fabricating the ferroelectric capacitor of claim 13, wherein the impurity layer is reduced on the ferroelectric layer to have a leakage current density of about $1 E^{-10}$ to about $1 E^{-6}$ A/cm$^2$ in the ferroelectric layer.

* * * * *